(12) United States Patent
Lipson

(10) Patent No.: US 9,831,630 B2
(45) Date of Patent: Nov. 28, 2017

(54) LOW COST SMALL SIZE LIDAR FOR AUTOMOTIVE

(71) Applicant: GM GLOBAL TECHNOLOGY OPERATIONS LLC, Detroit, MI (US)

(72) Inventor: Ariel Lipson, Tel Aviv (IL)

(73) Assignee: GM Global Technology Operations LLC, Detroit, MI (US)

( * ) Notice: Subject to any disclaimer, the term of this patent is extended or adjusted under 35 U.S.C. 154(b) by 418 days.

(21) Appl. No.: 14/612,605

(22) Filed: Feb. 3, 2015

(65) Prior Publication Data

US 2015/0219764 A1  Aug. 6, 2015

Related U.S. Application Data

(60) Provisional application No. 61/936,524, filed on Feb. 6, 2014.

(51) Int. Cl.
| | |
|---|---|
| *G01C 3/08* | (2006.01) |
| *H01S 5/00* | (2006.01) |
| *G01S 17/36* | (2006.01) |
| *G01S 17/42* | (2006.01) |
| *G01S 17/89* | (2006.01) |
| *G01S 17/93* | (2006.01) |
| *G01S 7/481* | (2006.01) |

(52) U.S. Cl.
CPC ............. *H01S 5/00* (2013.01); *G01S 7/4815* (2013.01); *G01S 17/36* (2013.01); *G01S 17/42* (2013.01); *G01S 17/89* (2013.01); *G01S 17/936* (2013.01)

(58) Field of Classification Search
CPC .......... G01S 17/36; G01S 17/89; G01S 17/42; G01S 17/936; G01S 7/4815
USPC ......................................... 356/4.01
See application file for complete search history.

(56) References Cited

U.S. PATENT DOCUMENTS

| | | | |
|---|---|---|---|
| 7,544,945 B2 | 6/2009 | Tan et al. | |
| 9,383,445 B2* | 7/2016 | Lu ............... | G01S 7/4802 |
| 2007/0091295 A1* | 4/2007 | Xu ............... | G01C 3/08 |
| | | | 356/5.15 |
| 2010/0046953 A1* | 2/2010 | Shaw ............. | H01S 5/423 |
| | | | 398/115 |

FOREIGN PATENT DOCUMENTS

CN   102709808 A   10/2012

* cited by examiner

*Primary Examiner* — Mark Hellner
(74) *Attorney, Agent, or Firm* — John A. Miller; Miller IP Group, PLC

(57) ABSTRACT

A LiDAR sensor having particular application for use on a vehicle. The LiDAR sensor includes a plurality of spaced apart VCSEL arrays each including a single lens, where the lens for each VCSEL array directs the beam of the particular laser in the array that is illuminated in a desired direction so that turning on and off of the lasers in each array creates a scanning effect. The number and the size of the VCSEL arrays are selected to provide the desired FOV for the sensor, where the VCSEL arrays can be positioned on a curved platform to provide that FOV. The sensor also includes one or more detectors for detecting reflections of the laser beams emitted by the lasers. Control electronics are provided to scan the laser beams and generate a three-dimensional point cloud of return image points.

18 Claims, 5 Drawing Sheets

LOW COST SMALL SIZE LIDAR FOR AUTOMOTIVE

CROSS-REFERENCE TO RELATED APPLICATIONS

This application claims the benefit of the priority date of U.S. Provisional Patent Application Ser. No. 61/936,524, titled LOW COST SMALL SIZE LIDAR FOR AUTOMOTIVE, filed Feb. 6, 2014.

BACKGROUND OF THE INVENTION

Field of the Invention

This invention relates generally to a LiDAR sensor and, more particularly, to a LiDAR sensor for automotive applications, where the sensor employs a plurality of vertical cavity surface emitting laser (VCSEL) arrays each including a separate lens.

Discussion of the Related Art

Modern vehicles sometimes include various active safety and control systems, such as collision avoidance systems, adaptive cruise control systems, lane keeping systems, lane centering systems, etc., where vehicle technology is moving towards semi-autonomous and fully autonomous driven vehicles. For example, collision avoidance systems are known in the art that provide automatic vehicle control, such as braking, if a potential or imminent collision with another vehicle or object is detected, and also may provide a warning to allow the driver to take corrective measures to prevent the collision. Also, adaptive cruise control systems are known that employ a forward looking sensor that provides automatic speed control and/or braking if the subject vehicle is approaching another vehicle. The object detection sensors for these types of systems may use any of a number of technologies, such as short range radar, long range radar, cameras with image processing, laser or LiDAR, ultrasound, etc. The object detection sensors detect vehicles and other objects in the path of a subject vehicle, and the application software uses the object detection information to provide warnings or take actions as appropriate.

LiDAR sensors are sometimes employed on vehicles to detect objects around the vehicle and provide a range to and orientation of those objects using reflections from the objects providing multiple scan points that combine as a point cluster range map, where a separate scan point is provided for every ½° or less across the field-of-view (FOV) of the sensor. Therefore, if a target vehicle or other object is detected in front of the subject vehicle, there may be multiple scan points that are returned that identify the distance of the target vehicle from the subject vehicle. By providing a cluster of scan return points, objects having various and arbitrary shapes, such as trucks, trailers, bicycle, pedestrian, guard rail, etc., can be more readily detected, where the bigger and/or closer the object to the subject vehicle the more scan points are provided.

Most known LiDAR sensors employ a single laser and a fast rotating mirror to produce a three-dimensional point cloud of reflections or returns surrounding the vehicle. As the mirror rotates, the laser emits pulses of light and the sensor measures the time that it takes the light pulse to be reflected and returned from objects in its FOV to determine the distance of the objects, known in the art as time-of-flight calculations. By pulsing the laser very quickly, a three-dimensional image of objects in the FOV of the sensor can be generated. Multiple sensors can be provided and the images therefrom can be correlated to generate a three-dimensional image of objects surrounding the vehicle. Other known LiDAR sensors rotate the entire laser system instead of just the mirror to provide signal scanning, but such systems typically suffer from being bulky and typically lack robustness.

The mirror referred to above is a relatively large and dominate part of the LiDAR sensor, and thus is responsible for much of the size and mass of the sensor, which also increases the cost of the sensor. Moreover, the mirror causes poor sensor robustness. Further, the single axis of the mirror means that the LiDAR sensor does not actually collect a real three-dimensional point cloud of returns, but a point cloud more similar to a two-dimensional distance over a single line, or multiple lines if more than one laser is employed. Particularly, because a single laser beam is scanned using a rotating mirror, the reflected beams do not provide a FOV in a direction vertical to the direction of the rotation of the mirror. In order to provide returns from those directions, additional lasers need to be provided, which provides limitations in design and increases costs. In order to fulfill the need for quick data updates, the mirror must rotate very fast, which only allows the measurement algorithms to be time-of-flight, which is also very costly as a result of the need for fast electronics. Also, the corresponding motor required to rotate the mirror adds significant size and weight to the LiDAR sensor. Further, because the mirror is large and bulky, it has a tendency to easily get out of alignment with the laser even in response to small disturbances on the vehicle. Also, the motor requires significant power and because the mirror rotates, there is a significant increase in the likelihood that the LiDAR sensor may fail as a result of mechanical wear. Thus, current LiDAR sensor designs are generally too costly to be implemented in mass produced vehicles.

Additionally, current LiDAR sensor designs do not allow for the signal returns from one sensor to another sensor, and as such with multiple vehicles operating in the same relative space, cross talk between sensors is an issue.

Another known LiDAR sensor is referred to as a flash LiDAR sensor that employs a single powerful laser that illuminates the entire sensor FOV. The sensor includes a fine array of special detectors that provide time-of-flight (TOF) range calculations to determine the distance to objects. These sensors tend to require a powerful and costly laser, a bulky and expensive imaging lens that has high resolution because the pixels are very small, the FOV is large and a significant amount of light needs to be collected, and a custom sensor array.

It is known in the art to provide a LiDAR sensor that employs a two-dimensional array of lasers and associated lens so as to create an opto-electronic scanning technique with no moving parts. The two-dimensional array of lasers can be a VCSEL array, known in the art, that is a semiconductor type laser, where each laser point source is fabricated on a wafer to the desired size. Each laser in a VCSEL array is electrically controlled so that the selected laser in the array can be switched on and off as desired. Therefore, by selectively turning the lasers on and off, the laser beam from the array is scanned to allow a three-dimensional return point cloud because the lasers are not aligned in a single line. However, this known LiDAR sensor is limited in its FOV because for larger FOVs the lens design that would be required to produce high spatial resolution would be very difficult to achieve, especially at low cost. Even known fish eye type lenses having wide FOVs are still limited in their FOV and provide poor resolution at their edges. Further, as the size of the VCSEL array increases to accommodate a wider FOV, the cost for providing such a large VCSEL array increases significantly. Also, the combination of large FOV and well collimated beams required for resolution and eye safety is difficult to obtain at low cost.

SUMMARY OF THE INVENTION

The present disclosure describes a LiDAR sensor having particular application for use on a vehicle. The LiDAR sensor includes a plurality of spaced apart VCSEL arrays each including a single lens, where the lens for each VCSEL array directs the beam of the particular laser in the array that is illuminated in a desired direction so that turning on and off of the lasers in each array creates a scanning effect. The number and the size of the VCSEL arrays are selected to provide the desired FOV for the sensor, where the VCSEL arrays can be positioned on a curved platform, or any other suitable shape, to provide that FOV. The sensor also includes one or more detectors for detecting reflections of the laser beams emitted by the lasers. Control electronics are provided to scan the laser beams and generate a three-dimensional point cloud of return image points.

Additional features of the present invention will become apparent from the following description and appended claims, taken in conjunction with the accompanying drawings.

DETAILED DESCRIPTION OF THE EMBODIMENTS

The following discussion of the embodiments of the invention directed to a LiDAR sensor including a plurality of VCSEL arrays is merely exemplary in nature, and is in no way intended to limit the invention or its applications or uses. For example, the LiDAR sensor of the present invention has particular application for use on a vehicle. However, as will be appreciated by those skilled in the art, the LiDAR sensor of the invention may have other applications.

Figure 1:
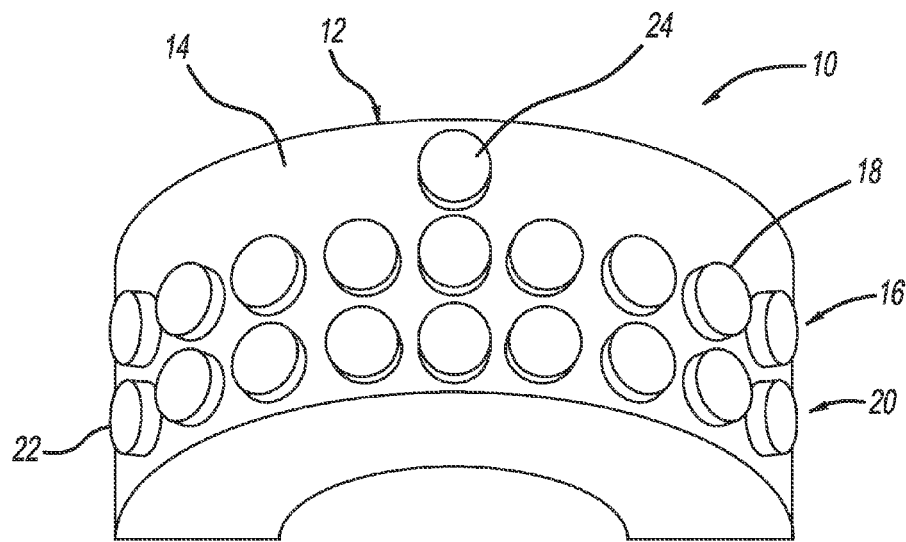
FIG. 1 is an isometric view of a LiDAR sensor including a plurality of emitters and receivers.

FIG. 1 is an isometric view of a LiDAR sensor 10 including a semi-circular sensor housing 12 having an outer curved surface 14. An assembly 16 of laser emitters 18 is provided in a row along the outer surface 14 of the housing 12. The various sensor electronics, processors, etc. will be provided in the housing 12. As will be discussed in detail below, each emitter 18 includes a VCSEL array and associated lens. The number, spacing, size, shape, etc. of the laser emitters 18 would be application specific for a particular LiDAR sensor. The number of the emitters 18 in the assembly 16 would depend on the desired FOV of the sensor 10 and the size of the emitters 18. In this non-limiting example, the assembly 16 includes nine of the emitters 18 to provide a 180° FOV. The sensor 10 also includes an assembly 20 of receivers 22 also configured in a line on the outer wall 14 of the housing 12, where a receiver 22 is correspondingly positioned relative to each of the emitters 18. The LiDAR sensor 10 also includes a wide FOV camera 24 positioned on the outer surface 14 of the housing 12 to provide an image of the same scene or FOV being detected by the receivers 22 for calibration purposes and otherwise, as will be discussed further below.

Figure 2:
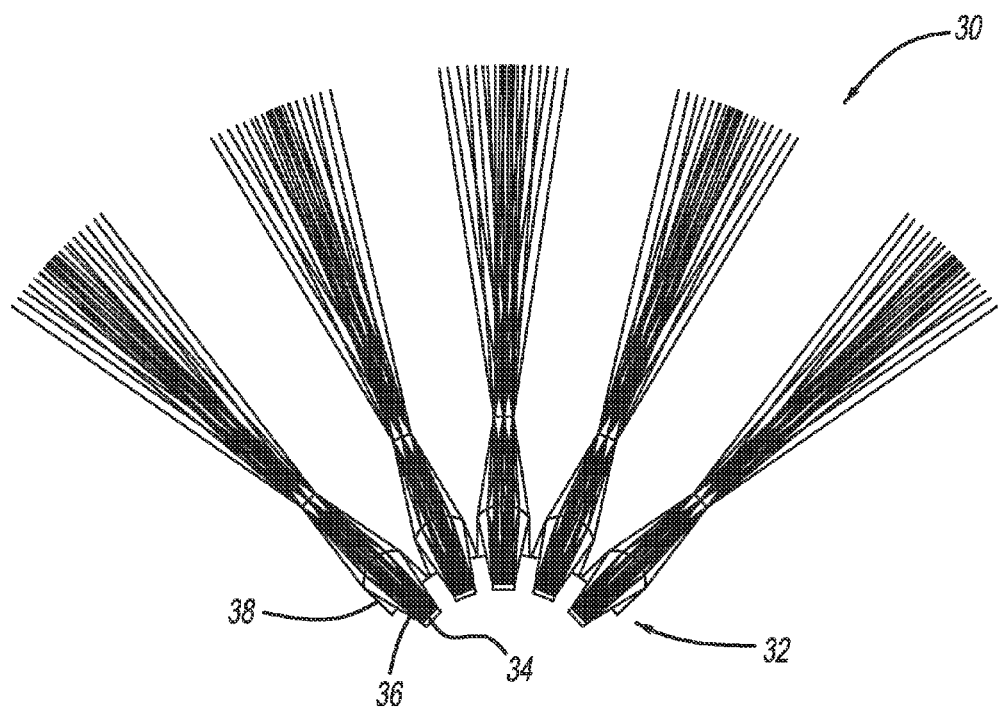
FIG. 2 is a schematic diagram of a LiDAR sensor system including a plurality of strategically positioned VCSEL arrays.

FIG. 2 is an illustration of an assembly 30 of emitters 32, here five, arranged in an arc configuration and providing a representation of the assembly 16. Each emitter 32 includes a VCSEL array 34 that is a two-dimensional array of individual vertical cavity surface emitting lasers (not shown) fabricated on a suitable semiconductor substrate in a manner that is well understood by those skilled in the art. In one embodiment, each VCSEL array 34 will include hundreds of lasers. Each laser in each VCSEL array 34 generates a laser beam 36 when turned on that is focused by a separate lens 38 in the emitter 32 to the desired focal distance, such as an appropriate distance from a vehicle on which the LiDAR sensor is mounted. It is noted that although a number of the laser beams 36 are shown being emitted from each of the VCSEL arrays 34, in operation only one of the lasers in each VCSEL array 34 will be turned on at any particular point in time, where the lasers in a particular VCSEL array 34 are turned on and off to create a scanning beam emitted from the array 34.

It is apparent by providing an emitter 32 of a particular size, the FOV of the particular sensor incorporating the plurality of the emitters 32 can be increased and decreased accordingly by changing the number of the emitters 32. Further, a single sensor can be provided that has enough of the emitters 32 to provide a circle, thus providing a 360° FOV. Thus, by providing a plurality of the emitters 32 each having its own lens 38, the drawbacks in the prior art can be overcome by not having any moving parts, such as a large rotating mirror, and not requiring a complicated mirror for wide FOV applications for a single VCSEL array.

Figure 3:
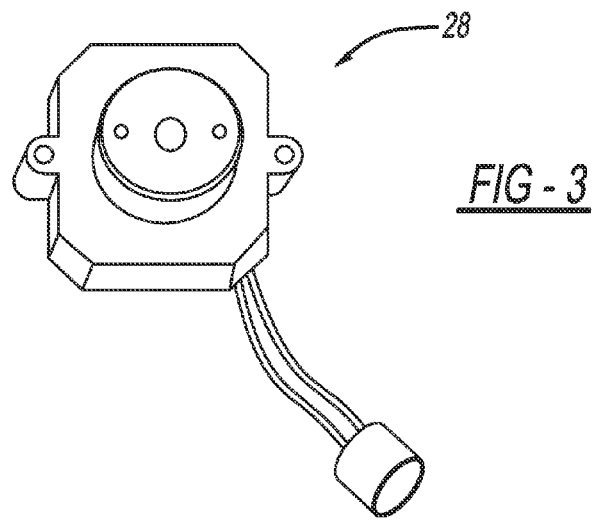
FIG. 3 is an isometric view of a wide field-of-view camera.

FIG. 3 is an isometric view of a wide FOV camera 28 of the type that can be used for the camera 24 mounted to the housing 12. The camera 28 provides a visual image of the same scene that the VCSEL arrays 34 are detecting so that the two images in different formats can be correlated by suitable software algorithms to provide enhanced object detection. Having redundancy in image detection may be desirable for calibration purposes or to ensure that the sensor has not been moved out of its desired FOV as a result of a collision or the like. Further, the camera 28 may provide better scene imaging in bad weather conditions, where the robustness of the LiDAR sensor 10 may be limited. Also, the camera 28 can be used to calibrate the arrays 34 because mechanical calibration may not provide proper calibration since slight tolerances in manufacturing and assembly can cause each array 34 to be slightly rotated, shifted or skewed relative to their intended position. A single camera that can view all of the laser beams at once can compensate any mechanical misalignment and further reduce manufacturing costs. Moreover, any misalignment that may occur over time or as a result of collisions can be self-calibrated.

Figure 4:
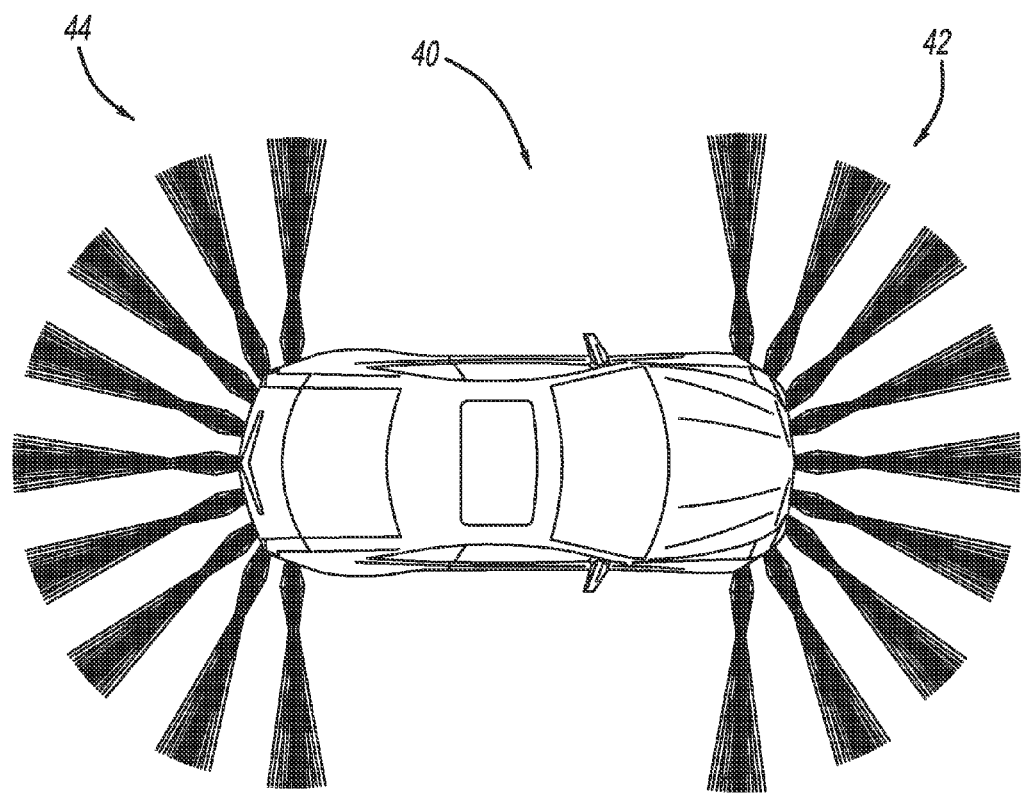
FIG. 4 is a top view of a vehicle including two 180° FOV LiDAR sensors.

FIG. 4 is a top view of a vehicle 40 showing one implementation of two of the LiDAR sensors discussed above. For example, one 180° FOV LiDAR sensor 42 can be provided at the front of the vehicle 40 and one 180° FOV LiDAR sensor 44 can be provided at the rear of the vehicle 40, as shown, to give a complete 360° FOV around the vehicle 40.

Figure 5:
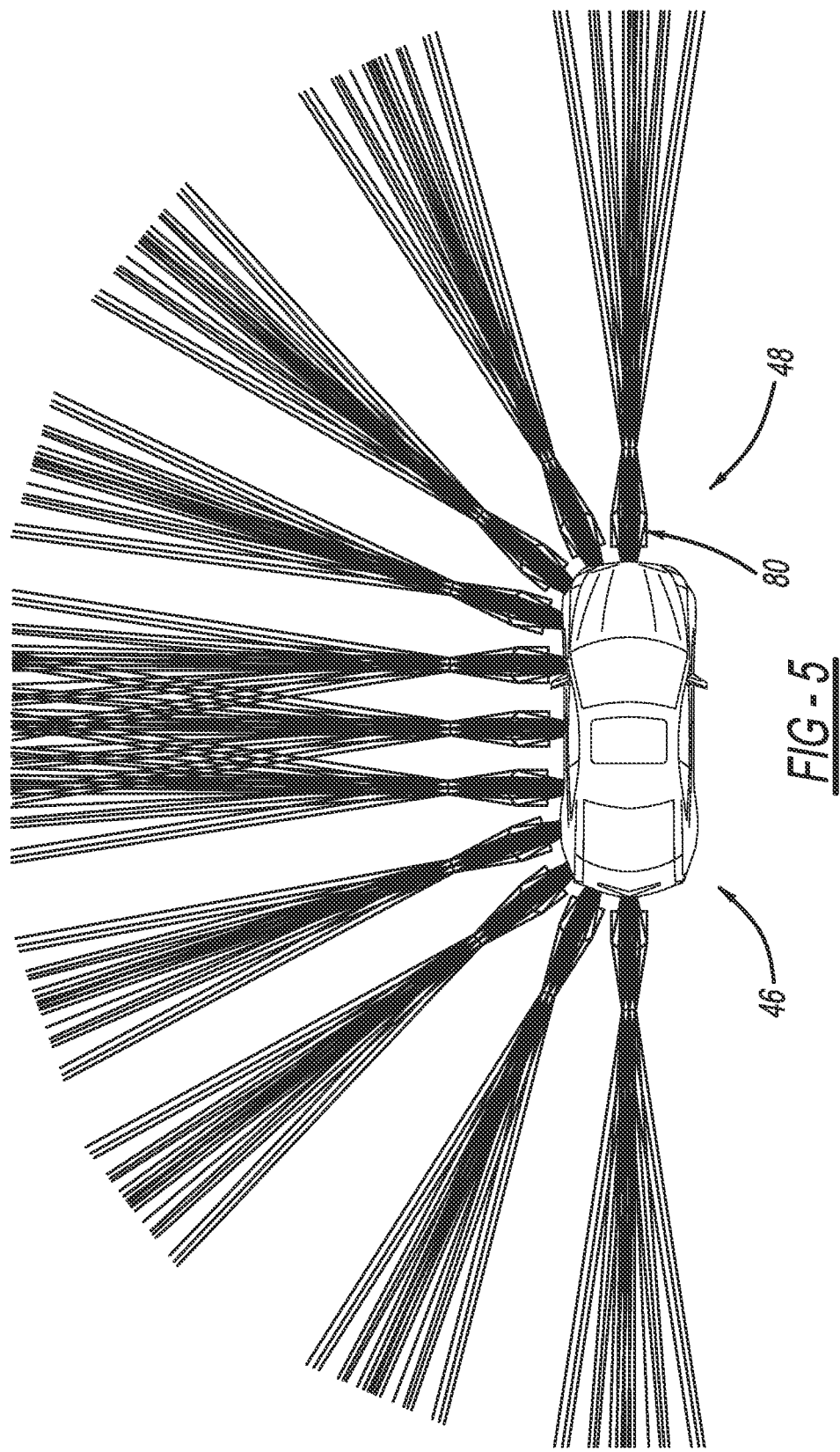
FIG. 5 is a top view of a vehicle including a single 180° FOV LiDAR sensor.

It is noted that shapes other than semi-circular or circular for the LiDAR sensor can also be provided. To illustrate this, FIG. 5 is a top view of a vehicle 46 showing another implementation of a single LiDAR sensor 48 of the type discussed above including a plurality of VCSEL arrays 80, here eleven, strategically positioned around the vehicle 46 and providing a 180° FOV, and also having a different shape the sensors discussed above. Other shapes may also be applicable.

As mentioned above, known LiDAR sensors employ time-of-flight to determine the distance of objects from which the pulsed laser beams are reflected. However, as also mentioned, this type of distance detection has limitations in that signals from other sensors may be received by a particular sensor, i.e., cross-talk between multiple sensors operating in the same general area. In order to overcome this limitation, the present invention proposes using range finding techniques to determine the distance D (see equation (1) below) of objects from the vehicle to eliminate or at least significantly reduce the possibility of cross-talk between sensors, which is possible because the proposed LiDAR sensor does not employ a rotating mirror. Each VCSEL in the array can be kept on as long as desired effectively providing a continuous wave signal beam. By amplitude modulating the continuous wave beam, a sine wave, or other repetitive signal, such as square waves, triangular waves, etc., is created having a certain frequency depending on the modulation. The sine wave signal is reflected off of the object and is detected by the detector with a phase shift that depends on the distance that the object is from the sensor. An electronic phase lock loop (PLL) can extract the phase shift from the signal and that phase shift is translated to a distance by known techniques. By modulating the continuous wave beam in a unique manner, the frequency of that beam can be different than the frequency of other beams that may be in the area of the vehicle, whose frequencies will be ignored by the particular LiDAR sensor. It is noted that providing amplitude modulation and the sine wave format as discussed is by way of a non-limiting example. Other techniques, such as phase modulation, polarization modulation and frequency modulation may also be applicable. In addition, other wave formats, such as a square wave, may also be employed.

$$D = \phi \frac{\text{max distance}}{2\pi} \quad (1)$$

As also mentioned above, LiDAR sensors that employ scanning mirrors are typically limited in observing targets in the direction perpendicular to the rotation direction of the mirror. For the VCSEL arrays of the invention, as discussed herein, the sensor can be designed to have an FOV in both the vertical and horizontal directions by providing a number of VCSELs in the array in the desired direction. Further, because the rotating mirror must continually rotate in the known LiDAR sensor designs, if an object of interest is detected in the returns, the known LiDAR sensors cannot stop the mirror to continue to detect in the direction of the detected object. With the present invention, if an object of interest is detected, then the VCSELs in the arrays that detect the object in that direction can be left on to provide further detection of the object.

Figure 6:
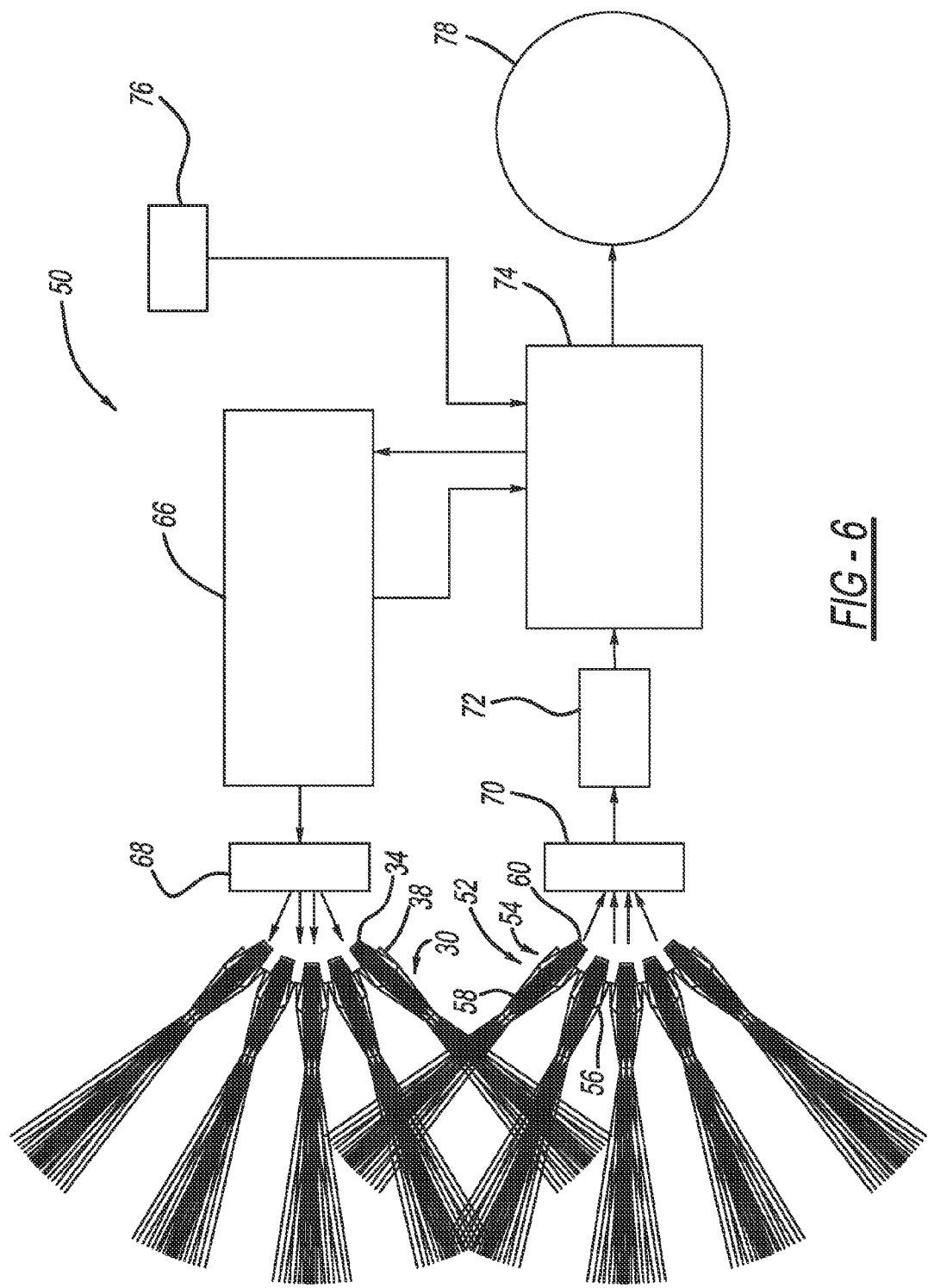
FIG. 6 is a block diagram of a system for providing three-dimensional images using the LiDAR sensor discussed herein.

FIG. 6 is a block diagram of a LiDAR sensor system 50 showing a general overview of the controls required to provide the sensor images. The system 50 includes the LiDAR sensor 30 discussed above and a detector assembly 52 including receiver elements 54, each having a receiving lens 56 that receives optical beams from the target and focuses the beams on a detector 60. The detector 60 may be a photodiode or photomultiplier, may be a single device or an array, and may be modulated to further reduce background noise. Each receiving element 54 includes the detector 60 that sees the same field-of-view as the whole LiDAR sensor 30. Thus, only one laser in the array 34 can be used at a particular point in time since one detector cannot distinguish separate beams. In an alternate embodiment, several lasers may be employed in parallel, and modulated at separate frequencies, and thus, can detect the beams in parallel, where an algorithm would separate the beams. In yet another embodiment, an array of detectors may be employed to separately detect several laser beams in parallel. Typically, a narrow pass-band filter can be employed in front of the detector 60 to eliminate ambient light, such as from the sun, where the VCSEL array 34 has a unique wavelength versus temperature stability.

The system 50 includes an emitter controller 66 that generates a command identifying which of the particular lasers in which of the laser arrays 34 is to be illuminated to provide the beam scanning and provides the modulation intensity signal for range finding purposes as discussed above. The signal from the emitter controller 66 is provided to a multiplexer 68 that sends the signal to the particular laser selected. The signals received by the detectors 60 are provided to a multiplexer 70 that selectively provides each signal to a fast analog-to-digital (A/D) converter 72 to convert the analog signal to a digital signal. The digital signal is provided to a receiver controller 74, which receives the modulation intensity signal from the emitter controller 66, and includes suitable software to construct the three-dimensional cloud scan points in the digital signal. The controller 74 can be any suitable logic device, such as a field programmable gate array (FPGA), ASIC, etc. The receiver controller 74 also receives the image data from a wide FOV camera represented by box 76 and combines the camera image and the three-dimensional cloud using suitable software. The receiver controller 74 provides a signal to the emitter controller 66 identifying which laser to illuminate such as, for example, if an object is detected. The receiver controller 74 then provides the image with the embedded three-dimensional data as represented by circle 78.

The system 50 discussed above uses phase measurements for providing range detection of objects detected by the sensor by comparing the transmitted optical signal to the reflected optical signal and then extracting the phase between the two signals. This process uses the electrical signal used to modulate the VCSLs in the VCSL arrays. However, this technique can be improved by providing a second reference detector that captures the actual laser light at the source, and uses that light to compare it to the reflected optical signal, which eliminates all of the electronic side effects and, if the same detector isn't used as the main detector, also eliminates detector behavior.

Figure 7:
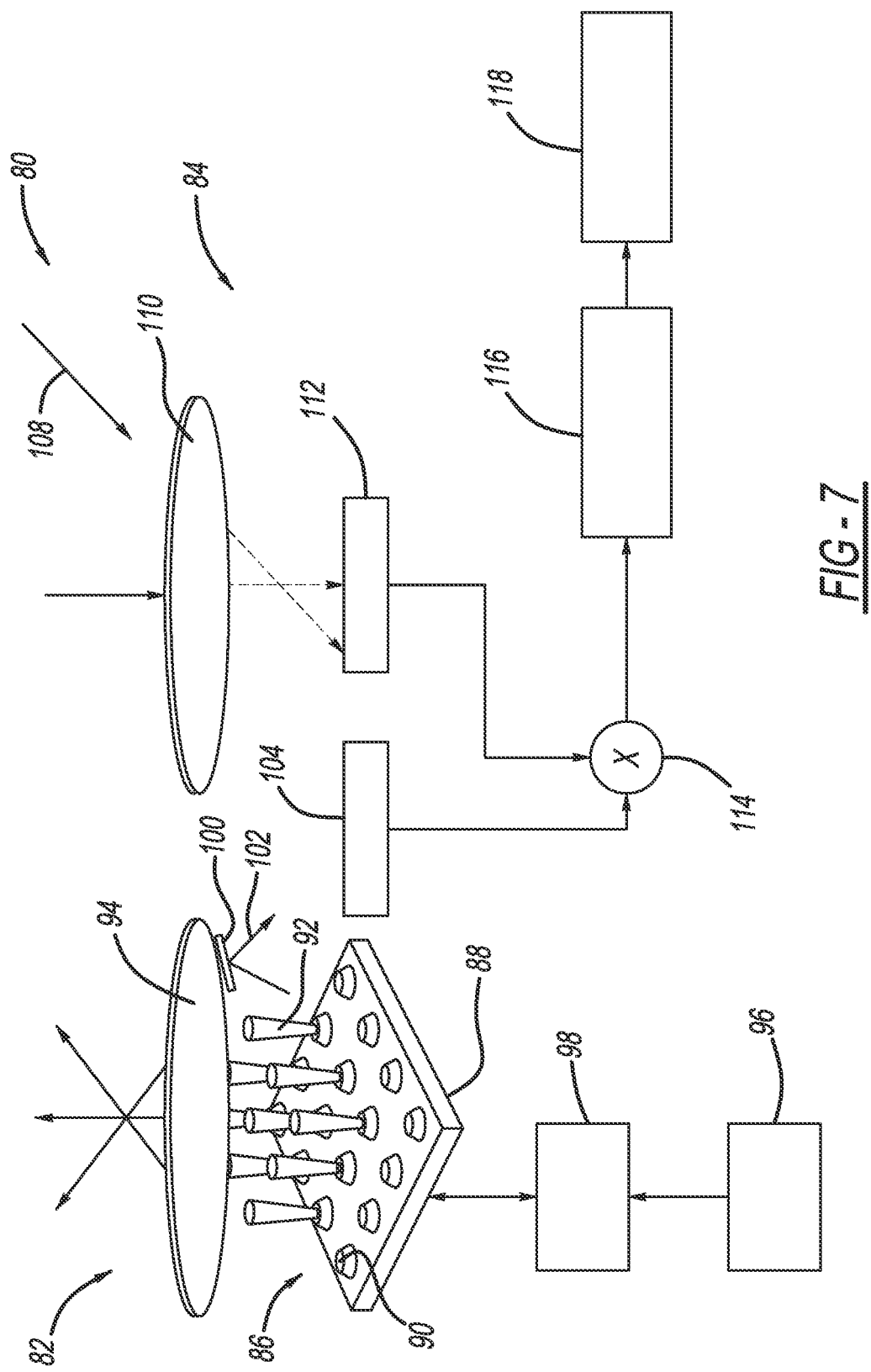
FIG. 7 is another block diagram of a system for providing three-dimensional images by employing laser range finding using the LiDAR sensor discussed herein.

FIG. 7 is a schematic block diagram of a LiDAR sensor system 80 illustrating this embodiment. The system 80 includes am emitter 82 and a receiver 84. The emitter 82 includes one VCSEL array 86 with the understanding that the emitter 82 will include many such VCSEL arrays as discussed above. The VCSEL array 86 includes a substrate 88 on which is fabricated a plurality of vertical cavity surface emitting laser 90 each being capable of emitting a laser beam 92. Each of the laser beams 92 separately generated by the laser 90 are focused by a lens 94 to provide the beam scanning as discussed above. An amplitude modulator and controller 96 generates an amplitude modulated sine wave signal that operates and controls the laser 90, where a multiplexer 98 directs the modulated signal to the desired laser 90. As discussed above, a small sample beam 102 of the laser beam 92 from a particular laser 90 is collected at the emitter 82 by, for example, a reflector 100 and directs it to the receiver 84.

The receiver 84 includes a lens 110 that directs a reflected beam 108 from the target or object to a main detector 112, such as a single-photon avalanche diode (SPAD) detector, which converts the optical signal to an electrical signal. The sample beam 102 is received by a reference detector 104 in the receiver 84, which also converts the optical signal to an electrical signal. The electrical signals from the detectors 104 and 112 are sent to a comparator 114 that provides an error signal between the two electrical signals which is sent to a phase shift retrieval processor 116 that identifies the phase shift between the sample beam 102 and the reflected beam 108. That phase shift is converted to a range by, for example, equation (1) at box 118.

It is noted that the discussion above concerning using VCSEL arrays for object detection, and including signal modulation and direction control can also be used as a communications tool between vehicles having the same sensor capabilities. Particularly, the same LiDAR sensor that is detecting other vehicles and objects around the subject vehicle can also be used to communicate with those other vehicles. That communication can be used in any suitable manner, such as for collision avoidance, autonomous driving, etc., where the two vehicles will tell each other their relative dynamics and motions so that they can safely coexist in proximity to each other.

As will be well understood by those skilled in the art, the several and various steps and processes discussed herein to describe the invention may be referring to operations performed by a computer, a processor or other electronic calculating device that manipulate and/or transform data using electrical phenomenon. Those computers and electronic devices may employ various volatile and/or non-volatile memories including non-transitory computer-readable medium with an executable program stored thereon including various code or executable instructions able to be performed by the computer or processor, where the memory and/or computer-readable medium may include all forms and types of memory and other computer-readable media.

The foregoing discussion disclosed and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A LiDAR sensor comprising a plurality of vertical cavity surface emitting laser (VCSEL) arrays each including a plurality of VCSELs, said sensor further including a separate lens positioned proximate each VCSEL array that receives and focuses a laser beam from each VCSEL in the particular array, said sensor further comprising a detector assembly for detecting reflected beams reflected from objects that receive the laser beams, where the sensor is configured to increase laser beam on-time for the VCSELs in a particular array in response to detection of said objects.

2. The sensor according to claim 1 wherein the sensor is configured to be used on an automobile.

3. The sensor according to claim 1 wherein the sensor has a 180° field-of-view.

4. The sensor according to claim 1 wherein the plurality of VCSEL arrays is nine VCSEL arrays.

5. The sensor according to claim 1 further comprising a camera having a same field-of-view as the VCSEL arrays.

6. The sensor according to claim 1 further comprising a semi-circular housing on which the plurality of VCSEL arrays are mounted.

7. The sensor according to claim 1 wherein the detector assembly includes a plurality of spaced apart detectors, where each detector includes a lens.

8. The sensor according to claim 1 wherein the detector assembly is part of a receiver including receiver electronics, said receiver electronics identifying a phase shift between the laser beams and the reflected beams for object range finding to determine the distance of the objects from the sensor.

9. The sensor according to claim 8 wherein the sensor includes emitter electronics that amplitude modulate the laser beams for the range finding.

10. The sensor according to claim 8 further comprising an optical device that provides a sample beam from the VCSEL arrays, said detector assembly including a reference detector that receives the sample beam and a main detector that receives the reflected beam, said receiver electronics using the sample beam and the reflected beam to determine the phase shift between the laser beam and the reflected beam.

11. An automotive LiDAR sensor comprising:
a plurality of vertical cavity surface emitting laser (VCSEL) arrays each including a plurality of VCSELs;
a separate lens positioned proximate each VCSEL array that receives and focuses a laser beam from each VCSEL in the particular array;
a detector assembly for detecting reflected beams reflected from objects that receive the laser beams;
receiver electronics responsive to the reflected beams and identifying a phase shift between the laser beams and the reflected beams for object range finding to determine the distance of the objects from the sensor; and
an optical device that provides a sample beam from the VCSEL arrays, said detector assembly including a reference detector that receives the sample beam and a main detector that receives the reflected beam, said receiver electronics using the sample beam and the reflected beam to determine the phase shift between the laser beam and the reflected beam.

12. The sensor according to claim 11 wherein the sensor includes emitter electronics that amplitude modulate the laser beams for the range finding.

13. The sensor according to claim 11 wherein the sensor has a 180° field-of-view.

14. The sensor according to claim 11 further comprising a camera having a same field-of-view as the VCSEL arrays.

15. The sensor according to claim 11 further comprising a semi-circular housing on which the plurality of VCSEL arrays are mounted.

16. A LiDAR sensor comprising:
a semi-circular housing;
an emitter including a plurality of vertical cavity surface emitting laser (VCSEL) arrays mounted on the housing each including a plurality of VCSELs and a separate lens positioned proximate each VCSEL array that receives and focuses a laser beam from each VCSEL in the particular array;

a receiver including a detector assembly for detecting reflected beams reflected from objects that receive the laser beams, said receiver further including receiver electronics responsive to the reflected beams and identifying a phase shift between the laser beams and the reflected beams for object range finding to determine the distance of the objects from the sensor, wherein the sensor has a 180° field-of-view; and an optical device that provides a sample beam from the VCSEL arrays, said detector assembly including a reference detector that receives the sample beam and a main detector that receives the reflected beam, said receiver electronics using the sample beam and the reflected beam to determine the phase shift between the laser beam and the reflected beam.

17. The sensor according to claim 16 wherein the emitter includes emitter electronics that amplitude modulate the laser beams for the range finding.

18. The sensor according to claim 16 further comprising a camera having a same field-of-view as the VCSEL arrays.

* * * * *